United States Patent
Shaviv et al.

(10) Patent No.: US 9,613,825 B2
(45) Date of Patent: Apr. 4, 2017

(54) PHOTORESIST STRIP PROCESSES FOR IMPROVED DEVICE INTEGRITY

(75) Inventors: Roey Shaviv, Palo Alto, CA (US); Kirk Ostrowski, San Jose, CA (US); David Cheung, Foster City, CA (US); Joon Park, Dublin, CA (US); Bayu Thedjoisworo, Santa Clara, CA (US); Patrick J. Lord, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 344 days.

(21) Appl. No.: 13/590,083

(22) Filed: Aug. 20, 2012

(65) Prior Publication Data

US 2013/0048014 A1   Feb. 28, 2013

Related U.S. Application Data

(60) Provisional application No. 61/528,029, filed on Aug. 26, 2011.

(51) Int. Cl.
| | | |
|---|---|---|
| *H01L 21/311* | (2006.01) | |
| *G03F 7/42* | (2006.01) | |
| *H01J 37/32* | (2006.01) | |

(52) U.S. Cl.
CPC ........ *H01L 21/31138* (2013.01); *G03F 7/427* (2013.01); *H01J 37/32449* (2013.01); *H01J 37/32724* (2013.01)

(58) Field of Classification Search
None
See application file for complete search history.

(56) References Cited

U.S. PATENT DOCUMENTS

| 4,201,579 A | 5/1980 | Robinson et al. |
|---|---|---|
| 4,357,203 A | 11/1982 | Zelez |

(Continued)

FOREIGN PATENT DOCUMENTS

| CN | 1402316 | 3/2003 |
|---|---|---|
| CN | 1720349 | 1/2006 |

(Continued)

OTHER PUBLICATIONS

Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.

(Continued)

*Primary Examiner* — Nicole Blan
(74) *Attorney, Agent, or Firm* — Weaver Austin Villeneuve & Sampson LLP

(57) ABSTRACT

Provided herein are methods and apparatus of hydrogen-based photoresist strip operations that reduce dislocations in a silicon wafer or other substrate. According to various embodiments, the hydrogen-based photoresist strip methods can employ one or more of the following techniques: 1) minimization of hydrogen budget by using short processes with minimal overstrip duration, 2) providing dilute hydrogen, e.g., 2%-16% hydrogen concentration, 3) minimization of material loss by controlling process conditions and chemistry, 4) using a low temperature resist strip, 5) controlling implant conditions and concentrations, and 6) performing one or more post-strip venting processes. Apparatus suitable to perform the photoresist strip methods are also provided.

18 Claims, 10 Drawing Sheets

(56) References Cited

U.S. PATENT DOCUMENTS

| | | | |
|---|---|---|---|
| 4,699,689 | A | 10/1987 | Bersin |
| 4,861,424 | A | 8/1989 | Fujimura et al. |
| 4,961,820 | A | 10/1990 | Shinagawa et al. |
| 5,122,225 | A | 6/1992 | Douglas |
| 5,158,644 | A | 10/1992 | Cheung et al. |
| 5,292,393 | A | 3/1994 | Maydan et al. |
| 5,354,386 | A | 10/1994 | Cheung et al. |
| 5,593,541 | A | 1/1997 | Wong et al. |
| 5,626,678 | A | 5/1997 | Sahin et al. |
| 5,633,073 | A | 5/1997 | Cheung et al. |
| 5,651,860 | A | 7/1997 | Li |
| 5,660,682 | A | 8/1997 | Zhao et al. |
| 5,707,485 | A | 1/1998 | Rolfson et al. |
| 5,767,021 | A | 6/1998 | Imai et al. |
| 5,773,201 | A | 6/1998 | Fujimura et al. |
| 5,792,269 | A | 8/1998 | Deacon et al. |
| 5,811,358 | A | 9/1998 | Tseng et al. |
| 5,814,155 | A | 9/1998 | Solis et al. |
| 5,817,406 | A | 10/1998 | Cheung et al. |
| 5,820,685 | A | 10/1998 | Kurihara et al. |
| 5,830,775 | A | 11/1998 | Maa et al. |
| 5,844,195 | A | 12/1998 | Fairbairn et al. |
| 5,895,272 | A | 4/1999 | Li |
| 5,900,351 | A | 5/1999 | Lutsic et al. |
| 5,908,672 | A | 6/1999 | Ryu et al. |
| 5,911,834 | A | 6/1999 | Fairbairn et al. |
| 5,968,324 | A | 10/1999 | Cheung et al. |
| 5,980,770 | A | 11/1999 | Ramachandran et al. |
| 6,013,574 | A | 1/2000 | Hause et al. |
| 6,030,901 | A * | 2/2000 | Hopper et al. ................ 438/711 |
| 6,039,834 | A | 3/2000 | Tanaka et al. |
| 6,045,618 | A | 4/2000 | Raoux et al. |
| 6,054,379 | A | 4/2000 | Yau et al. |
| 6,072,227 | A | 6/2000 | Yau et al. |
| 6,077,764 | A | 6/2000 | Sugiarto et al. |
| 6,083,852 | A | 7/2000 | Cheung et al. |
| 6,086,952 | A | 7/2000 | Lang et al. |
| 6,098,568 | A | 8/2000 | Raoux et al. |
| 6,107,184 | A | 8/2000 | Mandal et al. |
| 6,121,091 | A * | 9/2000 | Wang ........................ 438/275 |
| 6,125,788 | A | 10/2000 | Hills et al. |
| 6,127,262 | A | 10/2000 | Huang et al. |
| 6,129,091 | A | 10/2000 | Lee et al. |
| 6,130,166 | A | 10/2000 | Yeh |
| 6,156,149 | A | 12/2000 | Cheung et al. |
| 6,162,323 | A | 12/2000 | Koshimizu |
| 6,171,945 | B1 | 1/2001 | Mandal et al. |
| 6,177,347 | B1 | 1/2001 | Liu et al. |
| 6,184,134 | B1 | 2/2001 | Chaudhary et al. |
| 6,187,072 | B1 | 2/2001 | Cheung et al. |
| 6,193,802 | B1 | 2/2001 | Pang et al. |
| 6,194,628 | B1 | 2/2001 | Pang et al. |
| 6,203,657 | B1 | 3/2001 | Collison et al. |
| 6,204,192 | B1 | 3/2001 | Zhao et al. |
| 6,209,484 | B1 | 4/2001 | Huang et al. |
| 6,230,652 | B1 | 5/2001 | Tanaka et al. |
| 6,242,350 | B1 | 6/2001 | Tao et al. |
| 6,245,690 | B1 | 6/2001 | Yau et al. |
| 6,277,733 | B1 | 8/2001 | Smith |
| 6,281,135 | B1 | 8/2001 | Han et al. |
| 6,287,990 | B1 | 9/2001 | Cheung et al. |
| 6,303,523 | B2 | 10/2001 | Cheung et al. |
| 6,306,564 | B1 | 10/2001 | Mullee |
| 6,319,842 | B1 | 11/2001 | Khosla et al. |
| 6,324,439 | B1 | 11/2001 | Cheung et al. |
| 6,340,435 | B1 | 1/2002 | Bjorkman et al. |
| 6,342,446 | B1 | 1/2002 | Smith et al. |
| 6,348,725 | B2 | 2/2002 | Cheung et al. |
| 6,350,701 | B1 | 2/2002 | Yamazaki |
| 6,352,936 | B1 | 3/2002 | Jehoul et al. |
| 6,358,573 | B1 | 3/2002 | Raoux et al. |
| 6,361,707 | B1 | 3/2002 | Tanaka et al. |
| 6,365,516 | B1 | 4/2002 | Frenkel et al. |
| 6,395,092 | B1 | 5/2002 | Sugiarto et al. |
| 6,413,583 | B1 | 7/2002 | Moghadam et al. |
| 6,426,304 | B1 | 7/2002 | Chien et al. |
| 6,432,830 | B1 | 8/2002 | Merry |
| 6,448,187 | B2 | 9/2002 | Yau et al. |
| 6,465,964 | B1 | 10/2002 | Taguchi et al. |
| 6,511,903 | B1 | 1/2003 | Yau et al. |
| 6,511,909 | B1 | 1/2003 | Yau et al. |
| 6,517,913 | B1 | 2/2003 | Cheung et al. |
| 6,537,422 | B2 | 3/2003 | Sakuma et al. |
| 6,537,929 | B1 | 3/2003 | Cheung et al. |
| 6,541,282 | B1 | 4/2003 | Cheung et al. |
| 6,555,472 | B2 | 4/2003 | Aminpur |
| 6,562,544 | B1 | 5/2003 | Cheung et al. |
| 6,562,690 | B1 | 5/2003 | Cheung et al. |
| 6,569,257 | B1 | 5/2003 | Nguyen et al. |
| 6,593,247 | B1 | 7/2003 | Huang et al. |
| 6,596,655 | B1 | 7/2003 | Cheung et al. |
| 6,632,735 | B2 | 10/2003 | Yau et al. |
| 6,638,875 | B2 | 10/2003 | Han et al. |
| 6,656,832 | B1 | 12/2003 | Pan et al. |
| 6,660,656 | B2 | 12/2003 | Cheung et al. |
| 6,660,663 | B1 | 12/2003 | Cheung et al. |
| 6,663,715 | B1 | 12/2003 | Yuda et al. |
| 6,667,244 | B1 | 12/2003 | Cox et al. |
| 6,669,858 | B2 | 12/2003 | Bjorkman et al. |
| 6,680,164 | B2 | 1/2004 | Nguyen et al. |
| 6,680,420 | B2 | 1/2004 | Pang et al. |
| 6,689,930 | B1 | 2/2004 | Pang et al. |
| 6,693,043 | B1 | 2/2004 | Li et al. |
| 6,709,715 | B1 | 3/2004 | Lang et al. |
| 6,720,132 | B2 | 4/2004 | Tsai et al. |
| 6,730,593 | B2 | 5/2004 | Yau et al. |
| 6,734,115 | B2 | 5/2004 | Cheung et al. |
| 6,743,737 | B2 | 6/2004 | Yau et al. |
| 6,764,940 | B1 | 7/2004 | Rozbicki et al. |
| 6,770,556 | B2 | 8/2004 | Yau et al. |
| 6,777,173 | B2 | 8/2004 | Chen et al. |
| 6,787,452 | B2 | 9/2004 | Sudijono et al. |
| 6,797,188 | B1 | 9/2004 | Shen et al. |
| 6,800,571 | B2 | 10/2004 | Cheung et al. |
| 6,806,207 | B2 | 10/2004 | Huang et al. |
| 6,837,967 | B1 | 1/2005 | Berman et al. |
| 6,848,455 | B1 | 2/2005 | Shrinivasan et al. |
| 6,858,153 | B2 | 2/2005 | Bjorkman et al. |
| 6,869,896 | B2 | 3/2005 | Cheung et al. |
| 6,900,135 | B2 | 5/2005 | Somekh et al. |
| 6,902,682 | B2 | 6/2005 | Shang et al. |
| 6,930,061 | B2 | 8/2005 | Cheung et al. |
| 7,023,092 | B2 | 4/2006 | Yau et al. |
| 7,070,657 | B1 | 7/2006 | Cheung et al. |
| 7,074,298 | B2 | 7/2006 | Gondhalekar et al. |
| 7,160,821 | B2 | 1/2007 | Huang et al. |
| 7,186,648 | B1 | 3/2007 | Rozbicki et al. |
| 7,202,176 | B1 | 4/2007 | Goto et al. |
| 7,205,249 | B2 | 4/2007 | Cheung et al. |
| 7,227,244 | B2 | 6/2007 | Bjorkman et al. |
| 7,256,134 | B2 | 8/2007 | Kim et al. |
| 7,288,484 | B1 | 10/2007 | Goto et al. |
| 7,297,635 | B2 | 11/2007 | Toda et al. |
| 7,344,993 | B2 | 3/2008 | Balasubramaniam et al. |
| 7,390,755 | B1 | 6/2008 | Chen et al. |
| 7,432,209 | B2 | 10/2008 | Delgadino et al. |
| 7,465,680 | B2 | 12/2008 | Chen et al. |
| 7,468,326 | B2 | 12/2008 | Chen et al. |
| 7,556,712 | B2 | 7/2009 | Yi et al. |
| 7,560,377 | B2 | 7/2009 | Cheung et al. |
| 7,569,492 | B1 | 8/2009 | Chen et al. |
| 7,585,777 | B1 | 9/2009 | Goto et al. |
| 7,595,005 | B2 | 9/2009 | Balasubramaniam |
| 7,597,816 | B2 | 10/2009 | Chang et al. |
| 7,601,272 | B2 | 10/2009 | Nguyen et al. |
| 7,628,864 | B2 | 12/2009 | Moriya et al. |
| 7,651,949 | B2 | 1/2010 | Jo |
| 7,740,768 | B1 | 6/2010 | Goto et al. |
| 7,799,685 | B2 * | 9/2010 | Savas ................ H01L 21/02063 438/637 |
| 8,034,176 | B2 | 10/2011 | Tsukamoto et al. |
| 8,058,178 | B1 | 11/2011 | Goto et al. |
| 8,058,181 | B1 | 11/2011 | Chen et al. |
| 8,097,527 | B2 | 1/2012 | Yang |

(56) References Cited

U.S. PATENT DOCUMENTS

| | | |
|---|---|---|
| 8,129,281 B1 | 3/2012 | Cheung et al. |
| 8,173,547 B2 | 5/2012 | Winniczek et al. |
| 8,193,096 B2 | 6/2012 | Goto et al. |
| 8,435,895 B2 | 5/2013 | Chen et al. |
| 8,444,869 B1 | 5/2013 | Goto et al. |
| 8,591,661 B2 | 11/2013 | Cheung et al. |
| 8,598,037 B2 | 12/2013 | Winniczek et al. |
| 8,641,862 B2 | 2/2014 | Goto et al. |
| 8,716,143 B1 | 5/2014 | Cheung et al. |
| 8,721,797 B2 | 5/2014 | Cheung et al. |
| 9,373,497 B2 | 6/2016 | Chen et al. |
| 2001/0014529 A1 | 8/2001 | Chen et al. |
| 2001/0027023 A1 | 10/2001 | Ishihara |
| 2002/0000202 A1 | 1/2002 | Yuda et al. |
| 2002/0005392 A1 | 1/2002 | Luo et al. |
| 2002/0039625 A1 | 4/2002 | Powell et al. |
| 2002/0045331 A1 | 4/2002 | Aminpur |
| 2002/0072016 A1 | 6/2002 | Chen et al. |
| 2002/0078976 A1 | 6/2002 | Nguyen |
| 2002/0081854 A1 | 6/2002 | Morrow et al. |
| 2002/0090827 A1 | 7/2002 | Yokoshima |
| 2002/0111041 A1 | 8/2002 | Annapragada et al. |
| 2002/0132486 A1 | 9/2002 | Williams et al. |
| 2002/0139775 A1 | 10/2002 | Chang et al. |
| 2002/0151156 A1 | 10/2002 | Hallock et al. |
| 2002/0153099 A1* | 10/2002 | Wang et al. ............ 156/345.24 |
| 2002/0185151 A1 | 12/2002 | Qingyuan et al. |
| 2002/0185226 A1 | 12/2002 | Lea et al. |
| 2002/0187643 A1 | 12/2002 | Gu et al. |
| 2002/0197870 A1 | 12/2002 | Johnson |
| 2003/0036284 A1 | 2/2003 | Chou et al. |
| 2003/0045115 A1 | 3/2003 | Fang |
| 2003/0045131 A1 | 3/2003 | Verbeke et al. |
| 2004/0084412 A1 | 5/2004 | Waldfried et al. |
| 2004/0209469 A1 | 10/2004 | Harada et al. |
| 2004/0237997 A1 | 12/2004 | Rui et al. |
| 2004/0245091 A1 | 12/2004 | Karim et al. |
| 2004/0248414 A1 | 12/2004 | Tsai et al. |
| 2005/0022839 A1* | 2/2005 | Savas et al. ............... 134/1.2 |
| 2005/0026430 A1 | 2/2005 | Kim et al. |
| 2005/0079723 A1 | 4/2005 | Niimi et al. |
| 2005/0106888 A1 | 5/2005 | Chiu et al. |
| 2005/0158667 A1 | 7/2005 | Nguyen et al. |
| 2005/0196967 A1 | 9/2005 | Savas et al. |
| 2006/0046482 A1 | 3/2006 | Verhaverbeke |
| 2006/0051881 A1* | 3/2006 | Ditizio ................ H01L 43/12 438/3 |
| 2006/0102197 A1 | 5/2006 | Chiang et al. |
| 2006/0138399 A1 | 6/2006 | Itano et al. |
| 2006/0141758 A1 | 6/2006 | Naumann et al. |
| 2006/0154471 A1 | 7/2006 | Minami |
| 2006/0163202 A1 | 7/2006 | Shimitz |
| 2006/0182875 A1 | 8/2006 | Ose et al. |
| 2006/0191478 A1 | 8/2006 | Gondhalekar et al. |
| 2006/0201623 A1 | 9/2006 | Yoo |
| 2006/0289384 A1 | 12/2006 | Pavel et al. |
| 2007/0037396 A1 | 2/2007 | Verhaverbeke |
| 2007/0040172 A1 | 2/2007 | Kawakami et al. |
| 2007/0068900 A1 | 3/2007 | Kim et al. |
| 2007/0144673 A1 | 6/2007 | Yeom |
| 2007/0173066 A1 | 7/2007 | Kokura et al. |
| 2007/0178698 A1 | 8/2007 | Okita et al. |
| 2007/0224826 A1 | 9/2007 | Delgadino et al. |
| 2007/0235137 A1 | 10/2007 | Tsukamoto et al. |
| 2007/0281491 A1 | 12/2007 | Kamp |
| 2008/0026589 A1 | 1/2008 | Hubacek et al. |
| 2008/0044995 A1 | 2/2008 | Kang et al. |
| 2008/0102646 A1 | 5/2008 | Kawaguchi et al. |
| 2008/0160729 A1 | 7/2008 | Krueger et al. |
| 2008/0248656 A1 | 10/2008 | Chen et al. |
| 2008/0286697 A1 | 11/2008 | Verhaverbeke et al. |
| 2009/0053901 A1* | 2/2009 | Goto et al. ................... 438/725 |
| 2009/0056875 A1 | 3/2009 | Goto et al. |
| 2009/0061623 A1 | 3/2009 | Chang et al. |
| 2009/0117746 A1 | 5/2009 | Masuda |
| 2009/0200268 A1 | 8/2009 | Tappan et al. |
| 2009/0221148 A1 | 9/2009 | Udo et al. |
| 2009/0277472 A1* | 11/2009 | Rivkin et al. ................. 134/1.3 |
| 2009/0277871 A1 | 11/2009 | Berry et al. |
| 2010/0015812 A1 | 1/2010 | Nishikawa |
| 2010/0062591 A1 | 3/2010 | Lin et al. |
| 2010/0130017 A1 | 5/2010 | Luo et al. |
| 2010/0216312 A1 | 8/2010 | Yamamoto et al. |
| 2010/0308463 A1 | 12/2010 | Yu et al. |
| 2011/0006034 A1 | 1/2011 | Hilkene et al. |
| 2011/0031493 A1* | 2/2011 | Yamazaki et al. ............... 257/43 |
| 2011/0139175 A1 | 6/2011 | Cheung et al. |
| 2011/0139176 A1 | 6/2011 | Cheung et al. |
| 2011/0143548 A1 | 6/2011 | Cheung et al. |
| 2011/0223756 A1* | 9/2011 | Schaeffer ............ H01L 21/3105 438/591 |
| 2012/0211462 A1 | 8/2012 | Zhang et al. |
| 2012/0211473 A1 | 8/2012 | Goto et al. |
| 2013/0157465 A1 | 6/2013 | Chen et al. |
| 2014/0080309 A1 | 3/2014 | Park et al. |
| 2014/0120733 A1 | 5/2014 | Cheung et al. |
| 2014/0182619 A1 | 7/2014 | Goto et al. |
| 2015/0332933 A1 | 11/2015 | Cheung et al. |
| 2015/0357202 A1 | 12/2015 | Thedjoisworo et al. |

FOREIGN PATENT DOCUMENTS

| | | |
|---|---|---|
| CN | 1815697 A | 8/2006 |
| CN | 1868043 | 11/2006 |
| CN | 101015042 | 8/2007 |
| CN | 101057314 A | 10/2007 |
| CN | 101131928 | 2/2008 |
| EP | 0 304 068 | 2/1989 |
| EP | 1 077 476 | 2/2001 |
| EP | 1081754 | 7/2001 |
| EP | 1 956 638 | 8/2008 |
| GB | 2300303 A | 10/1996 |
| JP | S64-048418 A | 2/1989 |
| JP | H01-200628 | 8/1989 |
| JP | H05-275326 | 10/1993 |
| JP | H06-208972 | 7/1994 |
| JP | 08-293487 | 11/1996 |
| JP | H09-36099 | 2/1997 |
| JP | H10-209118 A | 8/1998 |
| JP | H11-087307 A | 3/1999 |
| JP | 2000-286248 A | 10/2000 |
| JP | 2001-110775 A | 4/2001 |
| JP | 2001-189305 A | 7/2001 |
| JP | 2001-308078 | 11/2001 |
| JP | 2003-100718 | 4/2003 |
| JP | 2003-264170 | 9/2003 |
| JP | 2005-268312 A | 9/2005 |
| JP | 2006-073612 | 3/2006 |
| JP | 2006-351594 | 12/2006 |
| JP | 2007/019367 | 1/2007 |
| JP | 2007-53344 | 3/2007 |
| JP | 2007-109744 A | 4/2007 |
| JP | 2007-515781 A | 6/2007 |
| JP | 2007-266610 | 10/2007 |
| JP | 2008-218997 | 9/2008 |
| JP | 2008-300704 | 12/2008 |
| JP | 2010-098279 A | 4/2010 |
| KR | 10-2004-0103073 | 12/2004 |
| TW | 387097 | 4/2000 |
| TW | 200535277 | 11/2005 |
| WO | WO 2004/051702 | 6/2004 |
| WO | WO 2004/102640 | 11/2004 |
| WO | WO 2005/017983 | 2/2005 |
| WO | WO 2006/028858 | 3/2006 |
| WO | WO 2011/071980 | 6/2011 |
| WO | WO 2011/072042 | 6/2011 |
| WO | WO 2011/072061 | 6/2011 |
| WO | WO 2012/018375 | 2/2012 |

OTHER PUBLICATIONS

Woody K. Chung, "Downstream Plasma Removal of Mobile Ion Impurity From SIO$_2$", Published Proceedings of the 8$^{th}$ International

(56) References Cited

OTHER PUBLICATIONS

Plasma Processing Symposium, Fall 1990, 7 pages.

Woody K, Chung, "Low Damage, Downstream RF Plasma Ashing of High Energy, Heavily Doped Implanted Resists," Semicon Korea, Dec. 1989.

A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.

Goto et al, "Enhanced Stripping of Low-K Films Using Downstream Gas Mixing," Novellus Systems, Inc., U.S. Appl. No. 10/890,653, filed Jul. 13, 2004.

U.S. Office Action for U.S. Appl. No. 10/890,653 mailed Jul. 27, 2005.

U.S. Final Office Action for U.S. Appl. No. 10/890,653 mailed Jan. 10, 2006.

U.S. Office Action for U.S. Appl. No. 10/890,653 mailed Jun. 26, 2006.

U.S. Office Action for U.S. Appl. No. 10/890,653 mailed Oct. 11, 2006.

U.S. Office Action for U.S. Appl. No. 10/890,653 mailed Apr. 5, 2007.

Notice of Allowance for U.S. Appl. No. 10/890,653 mailed Jun. 15, 2007.

Supplemental Notice of Allowance for U.S. Appl. No. 10/890,653 mailed Jul. 23, 2007.

Goto et al., "Enhanced Stripping of Low-K Films Using Downstream Gas Mixing," Novellus Systems, Inc., U.S. Appl. No. 11/011,273, filed Dec. 13, 2004.

Notice of Allowance for U.S. Appl. No. 11/011,273 mailed Nov. 28, 2006.

Goto et al, "Enhanced Stripping of Low-K Films Using Downstream Gas Mixing," Novellus Systems, Inc., U.S. Appl. No. 11/712,253, filed Feb. 27, 2007, pp. 1-28.

U.S. Office Action for U.S. Appl. No. 11/712,253 mailed Dec. 23, 2008.

Goto, et al., "Photoresist Strip Method for Low-K Dielectrics," U.S. Appl. No. 11/859,727, filed Sep. 21, 2007.

U.S. Office Action for U.S. Appl. No. 11/859,727 mailed Oct. 6, 2008.

Notice of Allowance for U.S. Appl. No. 11/859,727 mailed May 1, 2009.

Goto, et al., "High Dose Implantation Strip (HDIS) in H2 Base Chemistry," Novellus Systems, Inc., U.S. Appl. No. 12/251,305, filed Oct. 14, 2008.

Goto, et al., "Photoresist Strip Method for Low-K Dielectrics," U.S. Appl. No. 12/533,461, filed Jul. 31, 2009.

U.S. Office Action for U.S. Appl. No. 11/712,253 mailed Jul. 17, 2009.

Chen, et al., "Method for Post-Etch Cleans," U.S. Appl. No. 10/137,096, May 1, 2002.

U.S. Office Action for U.S. Appl. No. 10/137,096 mailed Jul. 11, 2003.

U.S. Final Office Action for U.S. Appl. No. 10/137,096 mailed Jul. 27, 2007.

Notice of Allowance for U.S. Appl. No. 10/137,096 mailed Jan. 15, 2008.

Chen, et al., "Method for Post-Etch Cleans," U.S. Appl. No. 12/111,095, filed Aug. 28, 2008.

U.S. Office Action for U.S. Appl. No. 12/111,095 mailed Aug. 25, 2008.

Notice of Allowance for U.S. Appl. No. 12/111,095 mailed Apr. 3, 2009.

Chen, et al., "Method for Post-Etch Cleans," U.S. Appl. No. 12/502,130, filed Jul. 31, 2009.

U.S. Office Action for U.S. Appl. No. 11/712,253 mailed Jan. 29, 2010.

Notice of Allowance for U.S. Appl. No. 11/548,801 mailed Feb. 17, 2010.

Cheung, et al., "Plasma Based Photoresist Removal System for Cleaning Post Ash Residue," U.S. Appl. No. 11/128,930, filed May 12, 2005.

U.S. Office Action for U.S. Appl. No. 11/128,930 mailed Sep. 13, 2006.

U.S. Final Office Action for U.S. Appl. No. 11/128,930 mailed Mar. 8, 2007.

U.S. Office Action for U.S. Appl. No. 11/128,930 mailed Mar. 19, 2007.

U.S. Office Action for U.S. Appl. No. 11/128,930 mailed Jun. 29, 2007.

U.S. Office Action for U.S. Appl. No. 11/128,930 mailed Dec. 10, 2007.

U.S. Final Office Action for U.S. Appl. No. 11/128,930 mailed Jul. 21, 2008.

U.S. Office Action for U.S. Appl. No. 11/128,930 mailed Mar. 20, 2009.

U.S. Office Action for U.S. Appl. No. 11/128,930 mailed Sep. 17, 2009.

U.S. Office Action for U.S. Appl. No. 11/128,930 mailed Feb. 26, 2010.

U.S. Final Office Action for U.S. Appl. No. 11/128,930 mailed Sep. 9, 2010.

S. Wolf and R.N. Tauber, (Silicon Processing for the VLSI Era, vol. 1—Process Technology, Lattice Press, 1986), pp. 539-543.

U.S. Office Action for U.S. Appl. No. 12/533,461 mailed Nov. 5, 2010.

U.S. Office Action for U.S. Appl. No. 12/502,130 mailed Dec. 8, 2010.

Cheung, et al. "Ultra Low Silicon Loss High Dose Implant Strip," U.S. Appl. No. 12/636,582, filed Dec. 11, 2009.

Cheung, et al. "Low Damage Photoresist Strip Method for Low-K Dielectrics," U.S. Appl. No. 12/636,601, filed Dec. 11, 2009.

Cheung, et al. "Enhanced Passivation Process to Protect Silicon Prior to High Dose Implant Strip," U.S. Appl. No. 12/963,503, filed Dec. 8, 2009.

U.S. Office Action for U.S. Appl. No. 11/712,253 mailed Mar. 1, 2011.

U.S. Office Action for U.S. Appl. No. 11/128,930 mailed May 10, 2011.

U.S. Final Office Action for U.S. Appl. No. 12/533,461 mailed May 26, 2011.

International Search Report and Written Opinion for Application No. PCT/US2010/059388 mailed Jun. 27, 2011.

International Search Report and Written Opinion for Application No. PCT/US2010/059547 mailed Jul. 13, 2011.

International Search Report and Written Opinion for Application No. PCT/US2010/059517 mailed Jul. 14, 2011.

Notice of Allowance for U.S. Appl. No. 12/533,461 mailed Aug. 12, 2011.

Notice of Allowance for U.S. Appl. No. 12/502,130 mailed Aug. 12, 2011.

U.S. Office Action for U.S. Appl. No. 12/251,305 mailed Nov. 2, 2011.

U.S. Office Action for U.S. Appl. No. 12/786,230 mailed Nov. 10, 2011.

Notice of Allowance for U.S. Appl. No. 11/128,930 mailed Oct. 28, 2011.

Chen, et al., "Methods for Stripping Photoresist and/or Cleaning Metal Regions," U.S. Appl. No. 11/696,633, filed Apr. 7, 2007.

Office Action mailed Dec. 15, 2009, for U.S. Appl. No. 11/696,633.

Office Action mailed May 26, 2010, for U.S. Appl. No. 11/696,633.

Final Office Action mailed Sep. 20, 2010, for U.S. Appl. No. 11/696,633.

Office Action mailed Jun. 6, 2011, for U.S. Appl. No. 11/696,633.

Final Office Action mailed Sep. 28, 2011, for U.S. Appl. No. 11/696,633.

Office Action mailed Jan. 27, 2012, for U.S. Appl. No. 11/696,633.

Notice of Allowance for U.S. Appl. No. 12/251,305 mailed Feb. 17, 2012.

U.S. Final Office Action for U.S. Appl. No. 12/786,230 mailed Apr. 26, 2012.

(56) References Cited

OTHER PUBLICATIONS

Singapore Written Opinion and Search Report mailed Feb. 2, 2012, for Application No. 201104086-2.
Office Action mailed Mar. 30, 2012, for U.S. Appl. No. 12/636,601.
Goto, et al., "High Dose Implantation Strip (HDIS) in H2 Base Chemistry," Novellus Systems, Inc., U.S. Appl. No. 13/462,660, filed May 2, 2012.
Final Office Action mailed May 15, 2012, for U.S. Appl. No. 11/696,633.
Office Action mailed Jul. 27, 2012, for U.S. Appl. No. 12/963,503.
US Final Office Action, dated Sep. 5, 2012, issued in U.S. Appl. No. 12/636,601.
US Office Action, dated Sep. 6, 2012, issued in U.S. Appl. No. 12/636,582.
U.S. Appl. No. 13/274,638, filed Oct. 17, 2011, entitled "Photoresist Strip Method for Low-K Dielectrics."
U.S. Appl. No. 14/066,587, filed Oct. 29, 2013, entitled "Low Damage Photoresist Strip Method for Low-K Dielectrics."
U.S. Appl. No. 13/370,689, filed Feb. 10, 2012, entitled "Plasma Based Photoresist Removal System for Cleaning Post Ash Residue".
US Office Action dated Feb. 15, 2013, U.S. Appl. No. 13/274,638.
US Office Action, dated Apr. 26, 2013, issued in U.S. Appl. No. 13/462,660.
US Notice of Allowance, dated Sep. 30, 2013, issued in U.S. Appl. No. 13/462,660.
US Notice of Allowance, dated Dec. 31, 2013, issued in U.S. Appl. No. 13/462,660.
US Final Office Action, dated May 13, 2013, issued in U.S. Appl. No. 12/636,582.
US Advisory Action Before the Filing of an Appeal Brief, dated Sep. 20, 2013, issued in U.S. Appl. No. 12/636,582.
US Office Action, dated Feb. 12, 2013, issued in U.S. Appl. No. 12/636,601.
US Notice of Allowance, dated Jul. 23, 2013, issued in U.S. Appl. No. 12/636,601.
US Final Office Action, dated Jan. 22, 2013, issued in U.S. Appl. No. 12/963,503.
US Office Action, dated Aug. 23, 2013, issued in U.S. Appl. No. 12/963,503.
US Notice of Allowance dated Jan. 24, 2013, issued in U.S. Appl. No. 12/786,230.
US Office Action dated Feb. 22, 2013, issued in U.S. Appl. No. 13/370,689.
US Final Office Action dated Aug. 20, 2013, issued in U.S. Appl. No. 13/370,689.
US Office Action, dated Jul. 19, 2013, issued in U.S. Appl. No. 13/759,958.
US Final Office Action, dated Nov. 12, 2013, issued in U.S. Appl. No. 13/759,958.
Chinese Office Action dated Jul. 20, 2012, issued in Application No. 200810187894.4.
Chinese Office Action dated Jun. 19, 2013, issued in Application No. 200810187894.4.
Japanese Office Action dated Sep. 25, 2012, issued in Application No. 2009-018046.
Japanese Description of details of Reasons for Rejection dated Oct. 9, 2012, issued in Application No. 2009-018046.
Japanese Summary of Reasons for Rejection dated Sep. 3, 2013, issued in Application No. 2009-018046.
PCT International Preliminary Report on Patentability and Written Opinion, dated Jun. 21, 2012, issued in Application No. PCT/US2010/059388.
Singapore Second Written Opinion, dated Aug. 17, 2012, issued in Application No. 201104086-2.
PCT International Preliminary Report on Patentability and Written Opinion, dated Jun. 21, 2012, issued in Application No. PCT/US2010/059517.
Singapore Written Opinion, dated Jul. 15, 2013, issued in Application No. 201204092-9.
PCT International Preliminary Report on Patentability and Written Opinion, dated Jun. 21, 2012, issued in Application No. PCT/US2010/059547.
Singapore Office Action dated Aug. 1, 2013 issued in Applivcation No. 201203361-9.
European Partial Search Report dated Apr. 17, 2013 issued in Application No. 12 18 1659.
European Partial Search Report dated Aug. 19, 2013 issued in Application No. 12 18 1659.
Ghandhi, Sorab K., (1983) "VLSI Fabrication Principles," by John wiley & Sons, Inc., pp. 517-520.
U.S. Appl. No. 14/301,155, filed Jun. 10, 2014, entitled "Peroxide-Vapor Treatment for Enhancing Photoresist-Strip Performance and Modifying Organic Films."
US Office Action, dated Dec. 4, 2013, issued in U.S. Appl. No. 12/636,582.
US Office Action, dated Aug. 13, 2014, issued in U.S. Appl. No. 12/636,582.
US Supplemental Notice of Allowability, dated Nov. 5, 2013, issued in U.S. Appl. No. 12/636,601.
US Office Action, dated Apr. 10, 2014, issued in U.S. Appl. No. 14/066,587.
US Final Office Action, dated Oct. 9, 2014, issued in U.S. Appl. No. 14/066,587.
US Notice of Allowance, dated Feb. 12, 2014, issued in U.S. Appl. No. 12/963,503.
US Notice of Allowance dated Jan. 17, 2014, issued in U.S. Appl. No. 13/370,689.
US Notice of Allowance, dated Oct. 29, 2012, issued in U.S. Appl. No. 11/696,633.
US Notice of Allowance, dated Apr. 28, 2014, issued in U.S. Appl. No. 13/759,958.
US Notice of Allowance, dated Sep. 22, 2014, issued in U.S. Appl. No. 13/759,958.
Taiwan Search Report dated Feb. 17, 2014 issued in TW 097146496.
Taiwan Office Action dated Jun. 19, 2014 issued in TW 097146496.
Chinese First Office Action dated Sep. 24, 2014 issued in CN Application No. 201080056124.1.
Japanese Office Action dated Nov. 11, 2014 issued in JP 2012-543229.
Chinese First Office Action and Search Report dated Aug. 5, 2014 issued in CN 201080056102.5.
Japanese Office Action dated Nov. 11, 2014 issued in JP 2012-543254.
Singapore Examination Report, dated Mar. 21, 2014, issued in Application No. 201204092-9.
Chinese First Office Action and Search Report dated Sep. 1, 2014 issued in CN 201080055428.6.
Japanese Office Action dated Oct. 28, 2014 issued in JP 2012-543261.
Singapore Second Written Opinion dated Apr. 5, 2014 issued in Application No. 201203361-9.
Singapore Final Examination Report dated Nov. 3, 2014 issued in Application No. 201203361-9.
Singapore Search Report and Written Opinion dated Dec. 13, 2013 issued in SG 201206236-0.
Singapore Search and Examination Report dated Jul. 7, 2014, 2014 issued in SG 201206236-0.
Abe et al. (Aug. 2003) "Novel photoresist stripping technology using ozone/vaporized water mixture," IEEE Trans. Semicon. Manufact., 16(3):401-408.
De Gendt et al. (1999) "A Novel Resist and Post-Etch Residue Removal Process Using Ozonated Chemistry," Solid State Phenomena vols. 65-66:165-168.
Noda et al. (2003) "Development of a Photoresist Removal Method Using Ozone Gas with Water Vapor for LCD Manufacturing," J. Electrochem. Soc. 150(9):G537-G542.
US Final Office Action, dated Feb. 26, 2015, issued in U.S. Appl. No. 12/636,582.
US Office Action, dated Mar. 18, 2015, issued in U.S. Appl. No. 14/066,587.

(56) References Cited

OTHER PUBLICATIONS

US Final Office Action, dated Jul. 10, 2015, issued in U.S. Appl. No. 14/066,587.
Korean Office Action dated Feb. 25, 2015, issued in Application No. 2008-0116792.
Chinese Second Office Action dated Jun. 3, 2015 issued in CN Application No. 201080056124.1.
Chinese Second Office Action and Search Report dated Feb. 13, 2015 issued in CN 201080056102.5.
Taiwan Office Action dated Mar. 23, 2015, issued in Application No. 099143368.
Taiwan Office Action [Decision] dated Jul. 14, 2015, issued in Application No. 099143368.
Chinese Second Office Action dated Jun. 23, 2015 issued in CN 201080055428.6.
Taiwan Office Action dated Jun. 16, 2015 issued in Application No. 099143366.
US Office Action, dated Oct. 14, 2015, issued in U.S. Appl. No. 14/301,155.
US Final Office Action, dated Mar. 16, 2016, issued in U.S. Appl. No. 14/301,155.
US Office Action, dated Sep. 16, 2015, issued in U.S. Appl. No. 14/721,977.
Korean Office Action dated Nov. 19, 2015, issued in Application No. 2008-0116792.
Chinese Third Office Action dated Dec. 10, 2015 issued in CN Application No. 201080056124.1.
Japanese Office Action (Notice of Reasons for Rejection) dated Sep. 1, 2015 issued in JP 2012-543229.
Taiwan Office Action and Search Report, dated Nov. 20, 2015, issued in TW 099143367.
Chinese Third Office Action dated Sep. 28, 2015 issued in CN 201080056102.5.
Japanese Office Action [Decision of Rejection] dated Sep. 8, 2015 issued in JP 2012-543254.
Chinese Third Office Action dated Jan. 4, 2016 issued in CN 201080055428.6.
Chinese Fourth Office Action dated Apr. 5, 2016 issued in CN 201080055428.6.
US Notice of Allowance, dated Aug. 2, 2016, issued in U.S. Appl. No. 14/301,155.
US Final Office Action, dated May 13, 2016, issued in U.S. Appl. No. 14/721,977.
Chinese Fourth Office Action dated Jun. 14, 2016 issued in CN Application No. 201080056124.1.
US Notice of Allowance, dated Sep. 28, 2016, issued in U.S. Appl. No. 14/721,977.
Korean Office Action [Final Rejection] dated Sep. 8, 2015, issued in Application No. KR KR 2008-0116792.
Korean Notice of Scheduled date of Ruling mailed Oct. 18, 2016, for Application No. KR 2008-0116792.
Japanese Office Action dated Sep. 20, 2016 issued in Application No. JP 2012-186425.
Taiwan Office Action and Search Report dated Oct. 4, 2016 issued in Application No. TW 101130809.

\* cited by examiner

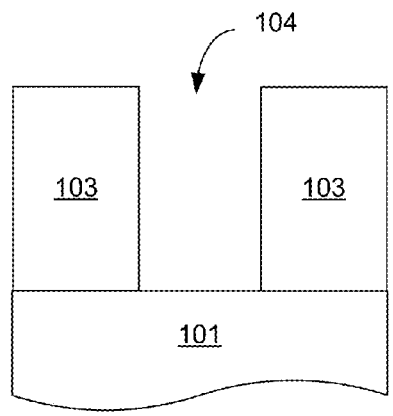
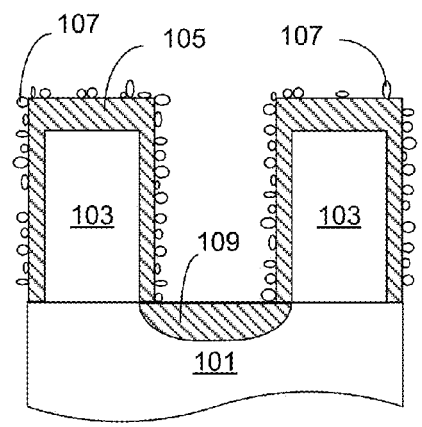
FIG. 1A              FIG. 1B
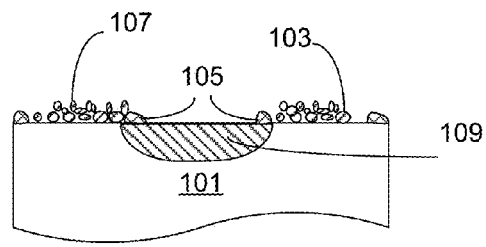
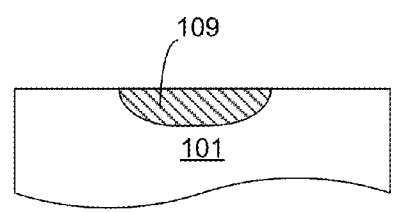
FIG. 1C              FIG. 1D

PHOTORESIST STRIP PROCESSES FOR IMPROVED DEVICE INTEGRITY

CROSS-REFERENCE TO RELATED APPLICATION

This application claims benefit under 35 USC §119(e) of U.S. Provisional Patent Application No. 61/528,029, filed Aug. 26, 2011, which is incorporated by reference herein.

BACKGROUND

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as etching, depositing, and ion implanting can be performed on the uncovered surface and the remaining photoresist. After performing one or more semiconductor processes, the remaining photoresist is removed in a strip operation.

SUMMARY

Provided herein are methods and apparatus of hydrogen-based photoresist strip operations that reduce dislocations in a silicon wafer or other substrate. According to various embodiments, the hydrogen-based photoresist strip methods can employ one or more of the following techniques: 1) minimization of hydrogen budget by using short processes with minimal overstrip duration, 2) providing dilute hydrogen, e.g., 2%-16% hydrogen concentration, 3) minimization of material loss by controlling process conditions and chemistry, 4) using a low temperature resist strip, 5) controlling implant conditions and concentrations, and 6) performing one or more post-strip venting processes. Apparatus suitable to perform the photoresist strip methods are also provided.

A method including providing a substrate having photoresist disposed thereon to reaction chamber and exposing the substrate to a plasma generated from a process gas comprising nitrogen and hydrogen and having a hydrogen concentration [H] of between about 2% and 16% to thereby remove photoresist from the substrate. In certain embodiments, the process gas comprises molecular nitrogen (N2) and molecular hydrogen (H2). In certain embodiments, the process gas contains substantially no oxygen-containing compounds. In embodiments, wherein the hydrogen concentration is between about 2% and 10% and can be less than 8%. In some embodiments, the hydrogen concentration about 4%.

Examples of process gasses chemistries include H2/N2, H2/N2/Ar, and H2/N2/He. In some embodiments, the substrate is exposed to the plasma for a time t and the cross-product of [H] and the time t ([H]×t) is between about 50 and 2000 sccm-seconds, or about between about 50 and 500 sccm-seconds. In certain embodiments, the substrate temperature is below about 285° C., for example between about 200° C. and 250° C.

Another aspect of the disclosure provided herein is a method including providing a substrate having photoresist disposed thereon to reaction chamber; exposing the substrate to a plasma generated from a process gas comprising hydrogen to thereby remove photoresist from the substrate; and after exposing the substrate to the plasma, venting the substrate at a substrate temperature between about 200° C. and 450° C. In some embodiments, the methods further include, after venting the substrate, performing a high temperature implant drive process at a substrate temperature of at least about 800° C. The hydrogen concentration of the process gas can be 16% or greater in certain embodiments. In certain embodiments, the hydrogen concentration [H] of the process gas is less than 16%. In certain embodiments, the hydrogen concentration [H] of the process gas is less than 10%. In certain embodiments, the hydrogen concentration [H] of the process gas is less than 5%.

Another aspect of the subject matter disclosed herein is an apparatus including a plasma source, a gas inlet for introducing a gas mixture into the plasma source, a showerhead positioned downstream of the gas inlet, a substrate support downstream of the showerhead, said substrate support comprising a pedestal and temperature-controlling mechanism to control a temperature of a substrate supported on the substrate support, and, a controller for executing a set of instructions for performing the methods described herein. In some embodiments, the set of instructions include instructions to introduce a gas mixture to the gas inlet comprising nitrogen and hydrogen and having a hydrogen concentration [H] of between about 2% and 16%. In some embodiments, the set of instructions includes instruction to maintain the temperature of the substrate at about 285° C. or less.

BRIEF DESCRIPTION OF THE DRAWINGS

FIGS. 1A-1D depicts various stages of semiconductor fabrication before and after ion implantation and stripping operations.

DETAILED DESCRIPTION

Figure 2:
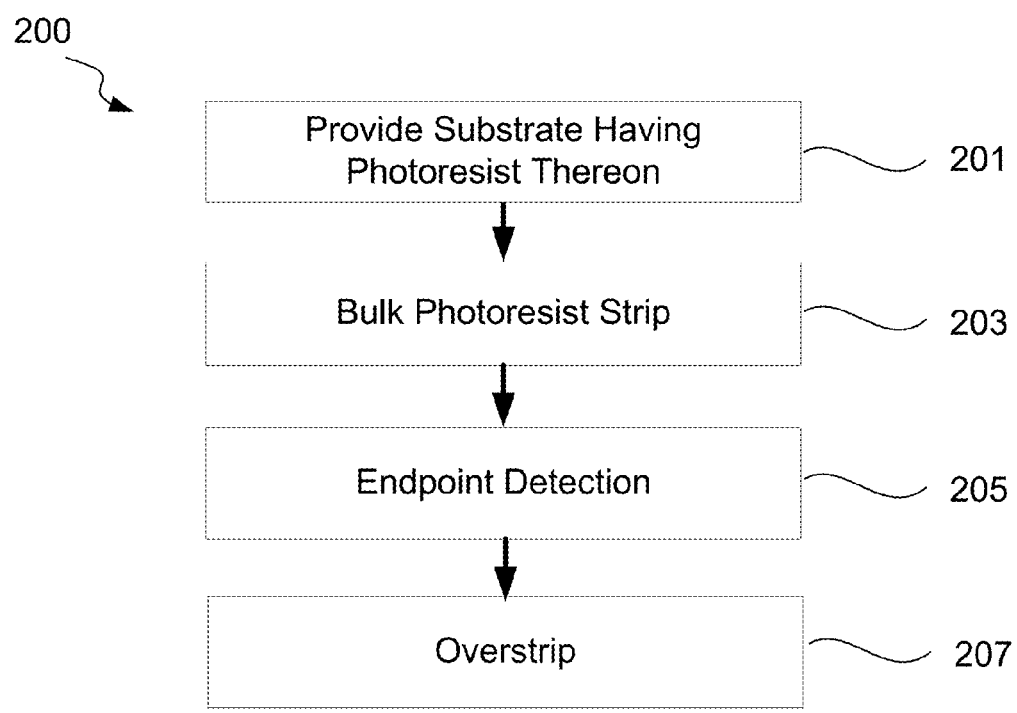
FIG. 2 shows a flow diagram illustrating certain operations of a photoresist strip process.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "work piece", "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as displays, printed circuit boards, and the like.

Photoresist is a light sensitive material used in certain fabrication processes to form a patterned coating on a work piece, e.g., a semiconductor wafer, during processing. After exposing the photoresist coated surface to a pattern of high energy radiation, a portion of the photoresist is removed to reveal the surface below, leaving the rest of the surface protected. Semiconductor processes such as etching, depositing, and ion implanting are performed on the uncovered surface and the remaining photoresist. After performing one or more semiconductor processes, the remaining photoresist is removed in a strip operation.

Front-End-of-Line (FEOL) fabrication processes, including p and n MOSFET and other transistor fabrication processes, DRAM storage capacitor fabrication processes, and flash floating gate fabrication processes can involve multiple lithographic patterning operations, and multiple photoresist strip processes. In some embodiments, the photoresist strip processes may be or include high dose implantation strip (HDIS) or other implant strip processes.

During ion implantation, dopant ions, e.g., ions of boron, boron difluoride, indium, gallium, thallium, phosphorous, arsenic, antimony, bismuth, carbon, xenon, argon or germanium, are accelerated toward a work piece target. The ions implant in exposed regions of the work piece as well as in the remaining photoresist surface. The process may form well regions (source/drain), lightly doped drain (LDD), halo implant regions, and doubled diffused drain (DDD) regions, as well as other implanted regions. The ion implant impregnates the resist with the implant species and depletes the surface of hydrogen. The outer layer or crust of the resist forms a carbonized layer that may be much denser than the underlying bulk resist layer. These two layers have different thermal expansion rates and react to stripping processes at different rates.

The difference between the outer layer and bulk layer is quite pronounced in post high-dose ion implant resist. In high-dose implantation, the ion dose may be greater than $1 \times 10^{15}$ ions/cm2 and the energy may be from 10 KeV to greater than 100 KeV. Traditional HDIS processes employ oxygen chemistries where monatomic oxygen plasma is formed away from the process chamber and then directed at the work piece surface. The reactive oxygen combines with the photoresist to form gaseous by-products which is removed with a vacuum pump. For HDIS, additional gases are needed to remove the implanted dopants with oxygen.

Primary implant strip considerations include strip rate, amount of residue, and film loss of the exposed and underlying film layer. Residues are commonly found on the substrate surface after implant and stripping. They may result from sputtering during the high-energy implant, incomplete removal of crust, and/or oxidation of implant atoms in the resist. After stripping, the surface should be residue free or substantially residue free to ensure high yield and eliminate the need for additional residue removal processing. Residues may be removed by overstripping, i.e., a continuation of the strip process past the point nominally required to remove all photoresist. Unfortunately, in conventional implant strip operations, overstripping sometimes removes some of the underlying functional device structure. At the device layer, even very little silicon loss from the transistor source/drain regions may adversely affect device performance and yield, especially for ultra shallow junction devices fabricated at the <32 nm design rule or below.

In some embodiments, the methods and apparatus may be used to efficiently and effectively to remove photoresist materials after high-dose ion implantation. The methods and apparatus are not limited to high-dose implant strip (HDIS). The methods and apparatus are also not limited to any particular category of dopants implanted. For instance, described methods and apparatus may be effectively used with stripping after medium or low dose implant. Although specific dopant ions such as boron, arsenic, and phosphorous are discussed, the described methods and apparatus may be effectively used to strip resist impregnated with other dopants, such as nitrogen, oxygen, carbon, germanium, and aluminum. Further, the methods and apparatus are not limited to post-implant removal of photoresist, but may also be used to remove photoresist that has not undergone an implantation.

The methods and apparatus described herein employ hydrogen-based chemistries to remove photoresist and/or related residues. In some embodiments, the chemistries include hydrogen with an optional gas such as nitrogen, helium, argon and the like with substantially no oxidant or fluorine-based chemistries. In some other embodiments, the chemistries may include an oxygen-containing compound and/or a fluorine containing compound.

The strip processes described herein generally involve generating a plasma from a plasma from a gas including various component gases. As indicated, the strip chemistries described herein are hydrogen-based. Molecular hydrogen ($H_2$) is typically a main component of the plasma-generating gas. In some embodiments, the strip chemistry for one or more of the operations of an overall strip process is generated from a gas consisting essentially of $H_2$ and $N_2$.

While hydrogen-based strip chemistries such as $H_2/N_2$ chemistries have resulted in clean, fast and effective removal of photoresist, certain hydrogen-based strip processes have been unexpectedly found to cause dislocations or other defects in silicon substrates during FEOL fabrication. These defects can compromise device integrity. Formation of dislocation in the Si crystal can be detrimental to device performance. In some cases dislocations can negate the positive effects of lattice straining and slow the device. In other cases dislocations can cause yield loss. In yet other cases, dislocations can create a device reliability problem, affecting long term operation. The methods and apparatus described herein provide effective photoresist stripping while reducing or minimizing defects.

FIGS. 1A-1D depicts various stages of semiconductor fabrication before and after ion implantation and stripping operations. While FIGS. 1A-1D provide an example of a fabrication process that may employ the methods described herein, the methods are not so limited and may be employed with any hydrogen-based photoresist strip process, with particular applications of FEOL processes. FIG. 1A shows a semiconductor substrate 101 coated with photoresist material 103. The substrate 101 may include one or more layers of deposited film, e.g., oxide film, silicide contact, and/or polysilicon film, or may be a bare silicon substrate, including for example a silicon-on-insulator type substrate. Initially, the photoresist material coats the entire substrate surface. The photoresist is then exposed to patterned radiation generated through a mask and developed to remove a portion of the material, e.g., the opening 104 shown in FIG. 1A between the remaining photoresist materials 103.

The substrate is then exposed to an ion implant process. During ion implant, the surface of the work piece or wafer is implanted with dopant ions. The process may be, for example, a plasma-immersion ion implantation (PIII) or ion beam implantation. The ions bombard the substrate surface, including the exposed silicon layer 101 and the photoresist 103. With high energy ion implantation, small amounts of the underlying material 107 may be sputtered to the photoresist sidewalls. See FIG. 1B. This material may include some of the implant species, other material in the plasma or ion beam, and by-products of the implantation. They include silicon, aluminum, carbon, fluorine, titanium, other contact materials such as cobalt, and oxygen in both elemental and compound forms. The actual species depend on the composition of the substrate before ion implant, the photoresist, and the implanted species.

At the exposed silicon layer 101, a doped region 109 is created. The ion energy or intensity of the bombardment determines the depth or thickness of the doped region. The density of the ion flux determines the extent of doping. The ions also impregnate the photoresist surface creating a crust layer 105. The crust layer 105 may be carbonized and highly cross-linked polymer chains. The crust is usually depleted of hydrogen and impregnated with the implant species. The crust layer 105 is denser than the bulk resist layer 103. The relative density depends on the ion flux while the thickness of the crust layer depends on the ion energy.

This crust layer 105 is harder to strip than the bulk photoresist 103 below. Removal rates of the crust layer may be 50% or 75% slower than the underlying bulk photoresist. The bulk photoresist contains relatively high levels of chemically bonded nitrogen and some of its original casting solvent. At elevated wafer temperature, e.g., above 150° C. to above 200° C., the bulk resist can outgas and expand relative to the crust layer. The entire photoresist can then "pop" as the underlying bulk photoresist builds up pressure under the crust. Photoresist popping is a source of particles and process defects because the residues are especially hard to clean from the wafer surface and chamber internal parts. With high-dose ion implantation, the density difference between the crust and underlying bulk photoresist layer is even higher. The crust may also be thicker.

FIG. 1C shows the substrate after a strip that fails to completely remove the photoresist 103 and the sidewall sputter residue 107. The sidewall sputter residue 107 may include particles that do not form a volatile compound under conventional strip chemistries. These particles may remain after a conventional strip operation. The residue may also include oxides of implanted species formed with the reactive oxygen used in the conventional strip chemistry, such as boron oxide and arsenic oxide. Portions of the crust 105 may also remain on the substrate. Crust sidewalls and corners at the bottom of photoresist vias may be hard to strip because of geometries. Stringers, long, narrow photoresist residue segments that may be left by non-exposure between two adjacent exposure areas, may also be present. These residue particles may be removed by overstripping. Overstrip is a continuation of the strip process past the point nominally required to remove all photoresist. If the photoresist is totally removed in some areas of the wafer but not others, continuation of the strip process would cause additional material, typically silicon and silicon oxide, to be removed from areas that are already stripped. FIG. 1D shows the substrate after all residue has been removed.

Described herein are hydrogen-containing plasma strip processes that can be used to strip photoresist after ion implantation or other post-patterning processing. For example, the methods and apparatus described herein can be implemented for post halo implant resist strip. The methods and apparatus reduce dislocations in a Si or other substrate that can compromise device integrity. As noted above, in certain embodiments, the hydrogen-containing plasmas may or may not contain other reactive species such as oxygen and fluorine species. Without being bound by a particular theory, it is believed that dislocations are more liable to be formed with hydrogen-based plasmas that do not contain oxygen, fluorine, or other species that can react with hydrogen. However, in some embodiments, the approaches described herein may be advantageously used with hydrogen-based plasmas that include oxygen, fluorine and other reactive species as well as those that do not.

According to various embodiments the hydrogen-based resist strip processes employ one or more of the following techniques: 1) minimization of hydrogen budget by using short processes with minimal overstrip duration, 2) providing dilute hydrogen, e.g., 2%-16% $H_2$, 3) minimization of material loss by controlling process conditions and chemistry, 4) using a low temperature resist strip, 5) controlling implant conditions and concentrations, and 6) performing one or more post-strip venting processes. These are discussed below.

FIG. 2 shows a flow diagram illustrating certain operations of a photoresist strip process. The process 200 begins at block 201 with providing a substrate having photoresist thereon. Examples of substrates having photoresist are described above with respect to FIGS. 1A-1C. The substrate can be a silicon substrate for example, including a silicon-on-insulator substrate. The photoresist can be directly on the surface of the silicon substrate in some embodiments. In some embodiments, one or more layers of deposited film or material may be between a silicon or other substrate and the photoresist. In some embodiments, the photoresist and substrate may have undergone an ion implantation process. The process 200 continues at block 203 with a bulk photoresist strip. In some embodiments, block 203 may be preceded by or include one or more operations to remove a thin crust layer. In certain embodiments, block 203 involves a hydrogen-based strip chemistry. Examples of strip chemistries include: $H_2/N_2$, $H_2/N_2/Ar$, $H_2/N_2/He$, $H_2/N_2$/other noble gas, $H_2/Ar$, $H_2/He$, and $H_2$/other noble gas. Other hydrogen-containing compounds may be used instead of or in addition to $H_2$. Examples include $NH_2$. Other inert compounds may be used instead of or in addition to the $N_2$, Ar or He. In these examples, the strip chemistry does not include oxidizing agents or halogen-containing compounds. In some other embodiments, the strip chemistry may include an oxidizing agent and/or a fluorine or other halogen-containing compound in addition to or instead of the $N_2$ and noble gases described. In some embodiments, an oxidizing agent may be a relatively strong oxidizing agent, such as $O_2$, or a weak oxidizing agent. Examples of weak oxidizing agents include carbon oxides such as carbon dioxide ($CO_2$), carbon monoxide (CO), nitrogen oxides such as nitrous oxide ($N_2O$), nitric oxide (NO), nitrogen dioxide ($NO_2$), and sulfur oxides such as sulfur oxide (SO) and sulfur dioxide ($SO_2$).

Examples of other weak oxides include any oxygen containing hydrocarbons (CxHyOz) and water ($H_2O$). Other examples of strong oxidants include ozone ($O_3$) and hydrogen peroxide ($H_2O_2$). Examples of fluorine-containing compounds include nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like.

The process 200 continues at block 205 with bulk resist strip end point detection. Block 205 can involve infrared detection, optical detection, emission detection or other appropriate detection method. The process 200 continues at block 207 with an overstrip operation. In some embodiments, the overstrip chemistry and process conditions are the same as used for the bulk photoresist strip in block 203. In some other embodiments, block 205 may involve using a different chemistry, component concentration, or process conditions than used in block 203. Examples include using a lower temperature, or hydrogen concentration than in block 203.

An overstrip operation can be measured as a percent duration of the bulk strip operation. At least part of a Si wafer or other substrate is covered by resist until the end point. During overstrip, the substrate may be particularly vulnerable to dislocations caused by a hydrogen-based chemistry. The duration of the over strip step is determined experimentally and may be different at different mask levels and implant steps. In some embodiments, overstrip duration ranges from about 0 to 200% of the time to end point, for example, 0 to 50%, or 0 to 20%. Minimizing the overstrip also reduces thermal budget and substrate exposure to plasma.

Figure 3:
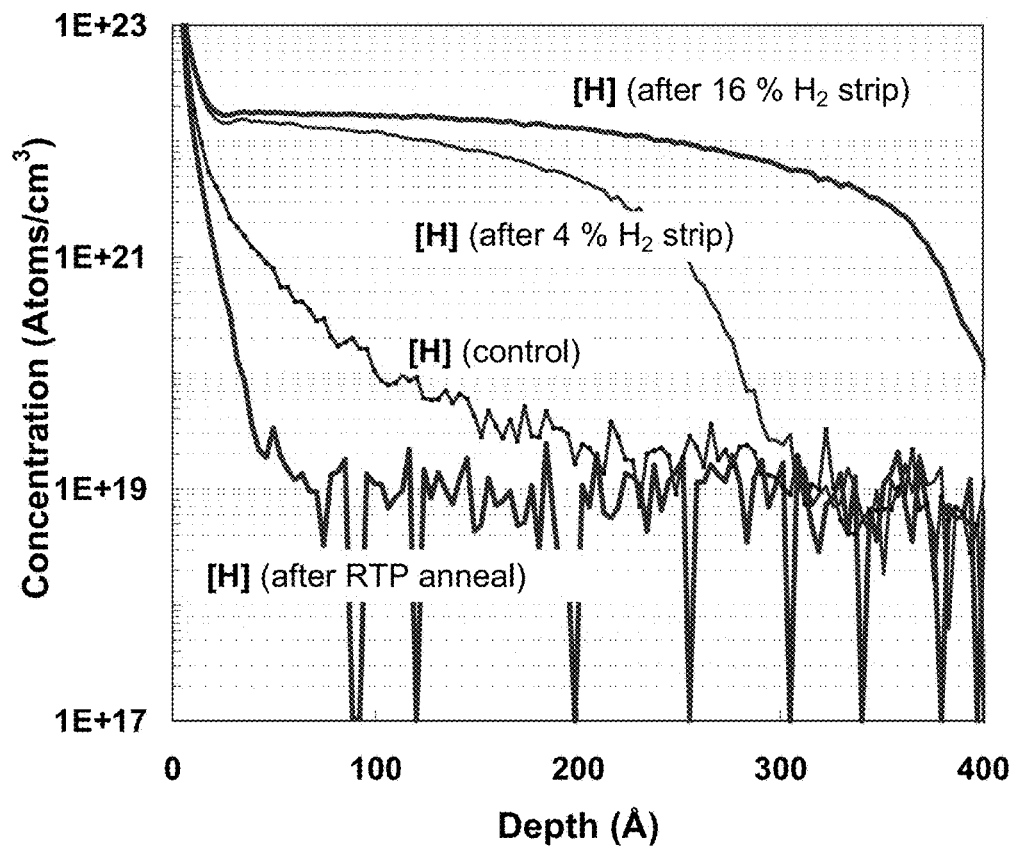
FIG. 3 is a graph showing the concentration of atoms up to a depth of 400 Å of silicon wafers after a) exposure to photoresist strip plasma using 16% $H_2$, b) exposure to photoresist strip plasma using 4% $H_2$, c) bare control Si wafer and d) after rapid thermal process (RTP) anneal at 900° C. for 30s.

In some embodiments, hydrogen absorption into the Si or other substrate is reduced by diluting the hydrogen with nitrogen or another inert gas. For example, hydrogen concentration [H] may be between about 2% and 16%, as measured in volumetric flow percentage. FIG. 3 is a graph showing the concentration of atoms (as measured by Secondary Ion Mass Spectrometry (SIMS)) up to a depth of 400 Å of silicon wafers after a) exposure to photoresist strip plasma using 16% $H_2$, b) exposure to photoresist strip plasma using 4% $H_2$, c) bare control Si wafer and d) after rapid thermal process (RTP) anneal at 900° C. for 30s. Nitrogen was used as the diluent for a) and b). FIG. 3 demonstrates that the number of H atoms in a wafer after strip is correlated to the [H] in the photoresist strip plasma. FIG. 3 also demonstrates that these atoms are driven out after RTP anneal, with the post-RTP curve not showing any signal above noise. Without being bound by a particular theory, it is believed that post-strip processing such as an RTP anneal that drives out H atoms may cause a shockwave in Si crystal that can cause dislocations.

While a strip process gas having [H] of 16% produces a clean that is fast and effective at removing stringers and other residue, it may cause dislocations in the substrate. Accordingly, in some embodiments, a strip process gas having an [H] of less than 16% is used, e.g., between 2% and 15% or 2% and 10%, to reduce defects. In some embodiments, the [H] is less than 8% or 5%.

Figure 4:
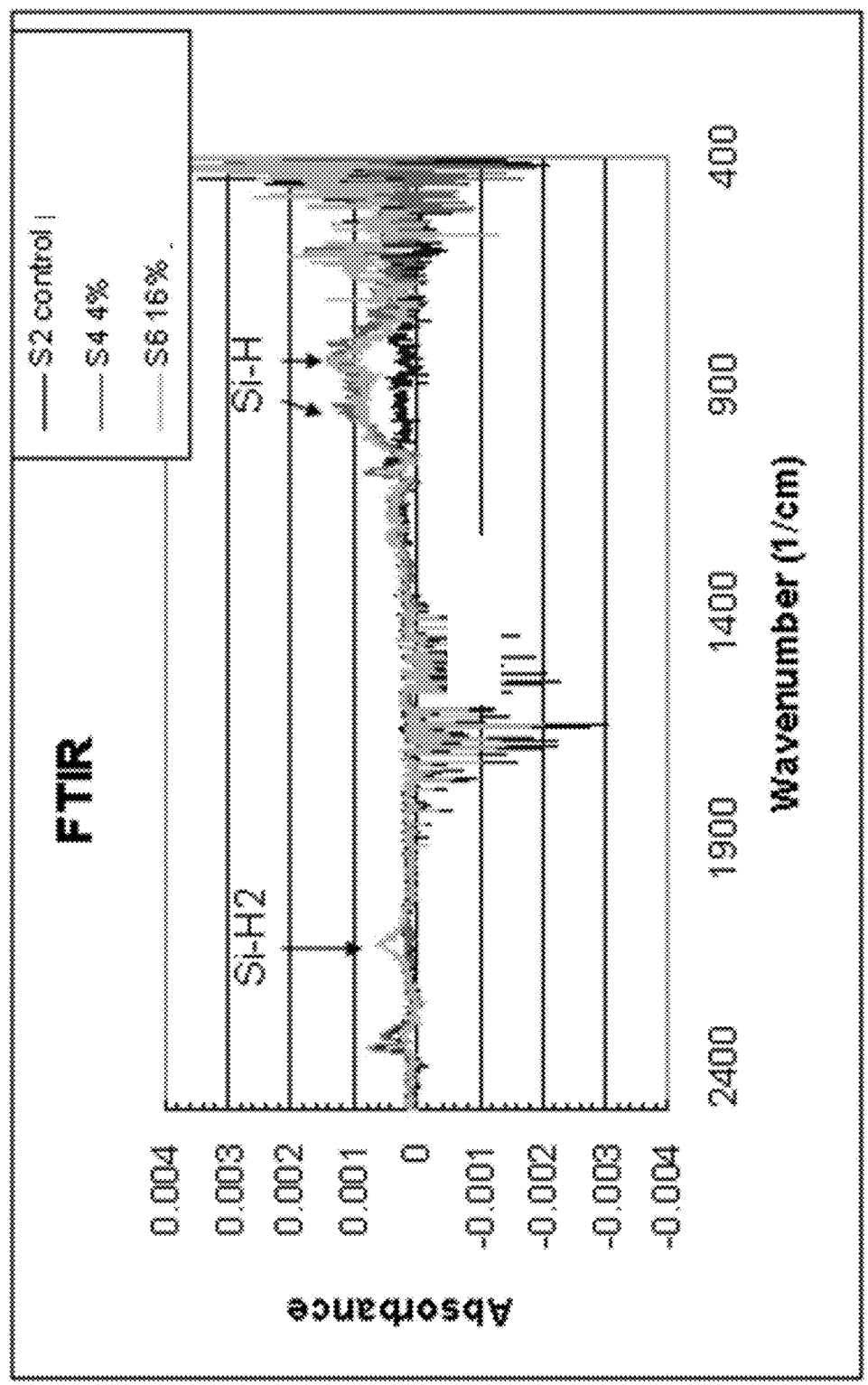
FIG. 4 shows FTIR spectra for silicon wafers after a) exposure to photoresist strip using 16% $H_2$, b) exposure to photoresist strip using 4% $H_2$, and c) bare control Si wafer.

FIG. 4 shows FTIR spectra for silicon wafers after a) exposure to photoresist strip using 16% $H_2$, b) exposure to photoresist strip using 4% $H_2$, and c) bare control Si wafer. As shown in FIG. 4, an increase in Si—H bonds are shown for the 4% and 16% spectra, while an increase in Si—H2 bonds is shown only for the 16% spectrum. This indicates that bonding in a Si wafer can be modulated by [H] in the strip chemistry.

In certain embodiments, hydrogen in the strip process gas is controlled to modulate the incorporation of hydrogen in the system as well as modulating bonding. This can be implemented by using a cross product [H]×time of between about 1 and 2400 sccm-seconds per layer, with [H] measured in volumetric flow and t. For example, [H]×time may be between about 50 and 2000 sccm-seconds, e.g., between 50 and 1000 sccm-seconds per layer, or between about 50 and 500 sccm-seconds per pass through the strip apparatus. Note that according to various embodiments, a strip operation having a cross product within these ranges may or may not also have an [H] of less than 16% as described above.

In some embodiments, a strip operation is performed a temperature between 100° C. and 400° C. In some embodiments, the temperature is below about 285° C., e.g., between 200° C. and 285° C., or between about 200° C. and 250° C. Both hydrogen absorption into the Si crystal, hydrogen diffusion inside the crystal, the formation of Si—H and Si—$H_2$ bonds and dislocation formation and propagation may be affected by temperature. Kink pair formation and motion may be affected by temperature. Low temperature and in particular low thermal budget (defined as the product of time and temperature in units of s·K) may have a strong effect of the kinetics of dislocations formation and propagation. Without being bound to a particular theory, it believed that rates of hydrogen diffusion and/or formation of Si—H and Si—$H_2$ bonds may exhibit Arrhenius behavior, exponentially related to temperature, with linear dependence on time and concentration. Accordingly, a process temperature of between 200° C. and 285° C., or between about 200° C. and 250° C. in some embodiments can reduce one or more mechanisms that may contribute comprising device integrity. The overall thermal budget may then be determined by minimizing material loss while leaving the substrate clean of residue.

Figure 5A:
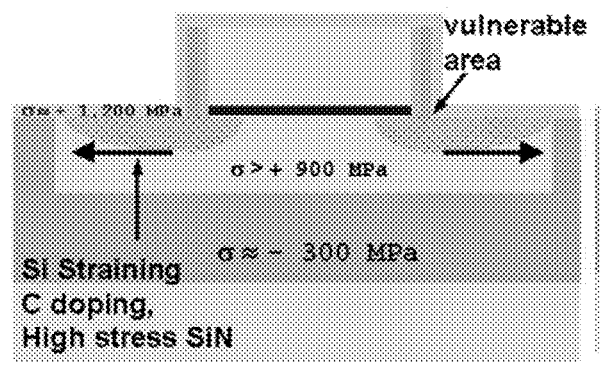
FIGS. 5A and 5B schematic illustrations of carbon doped silicon under a gate.
Figure 5B:
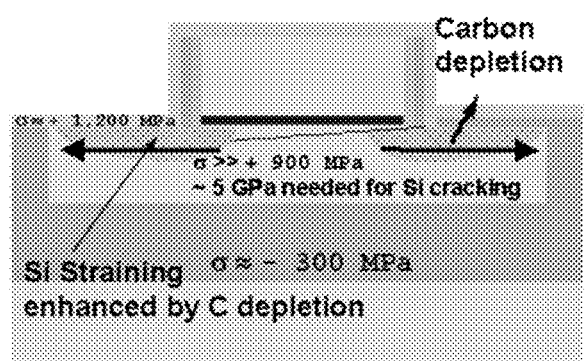
Figure 6:
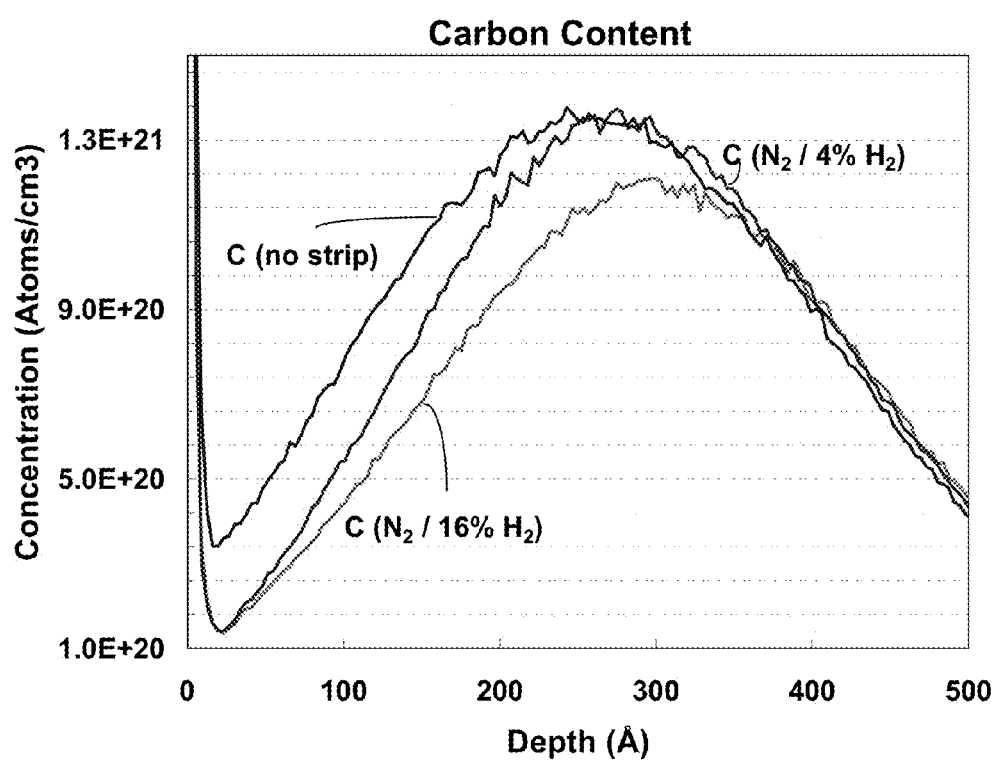
FIG. 6 shows an analysis of carbon content in crystalline Si as a function of exposure to hydrogen plasma.

In some embodiments, implant conditions and concentrations are controlled. FIG. 5A shows carbon doped silicon under a gate. The carbon impurities in a Si crystal, creating strain due the shorter Si—C bond. Tensile stress results in a larger than equilibrium lattice constant and longer Si—Si bonds. From the device perspective this is beneficial, causing higher density of charge carriers and a faster device. Mechanically, this is detrimental and is assisting in the formation of defects. In some embodiments, a hydrogen-based strip process can cause carbon depletion, creating a vacancy in the crystal and increasing strain. This is illustrated in FIG. 5B. FIG. 6 shows SIMS analysis of carbon content in crystalline Si as a function of exposure to hydrogen plasma. Lower levels of carbon are measured as hydrogen concentration in the plasma increases from 4% to 16%. The highest level of carbon is measured for the control, where no plasma was present. The interaction between implanted C and H from resist strip is shown in FIG. 6. In some embodiments, the effect of hydrogen on substrate straining due to reaction between hydrogen and carbon (or other doping element such as carbon, boron, phosphorous, arsenic etc.) is minimized by reducing dopant implant concentration. For example, a modulation of the carbon implant, by +/−15%, in conjunction with the hydrogen plasma process allows for straining engineering that enhances performance without undesired dislocations. According to various embodiments, a C implant dose range is $5*10^{14}$ to $5*10^{16}$ at energies of 6 to 10 KeV. For example, a process may use a dose of $6*10^{15}$ at 8 KeV. In some embodiments, a dopant implant dose calculated for a non-hydrogen based strip may be reduced by up to 15%.

Figure 7:
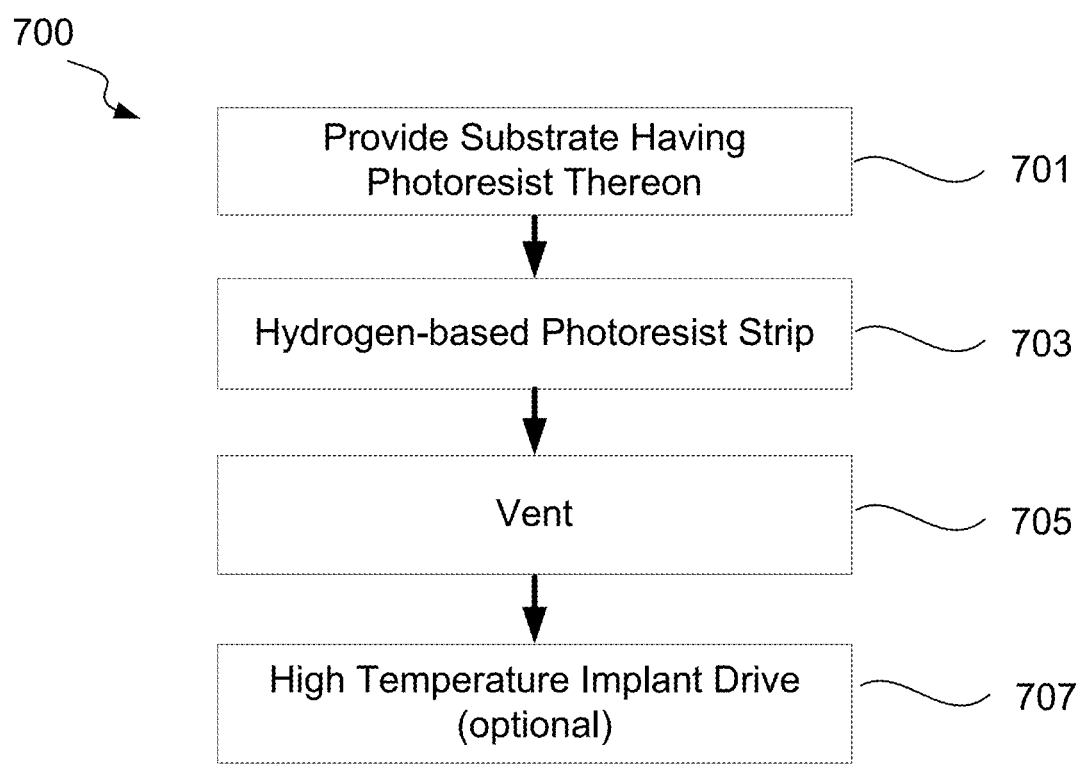
FIG. 7 shows a flow diagram illustrating certain operations of a photoresist strip process.
Figure 8:
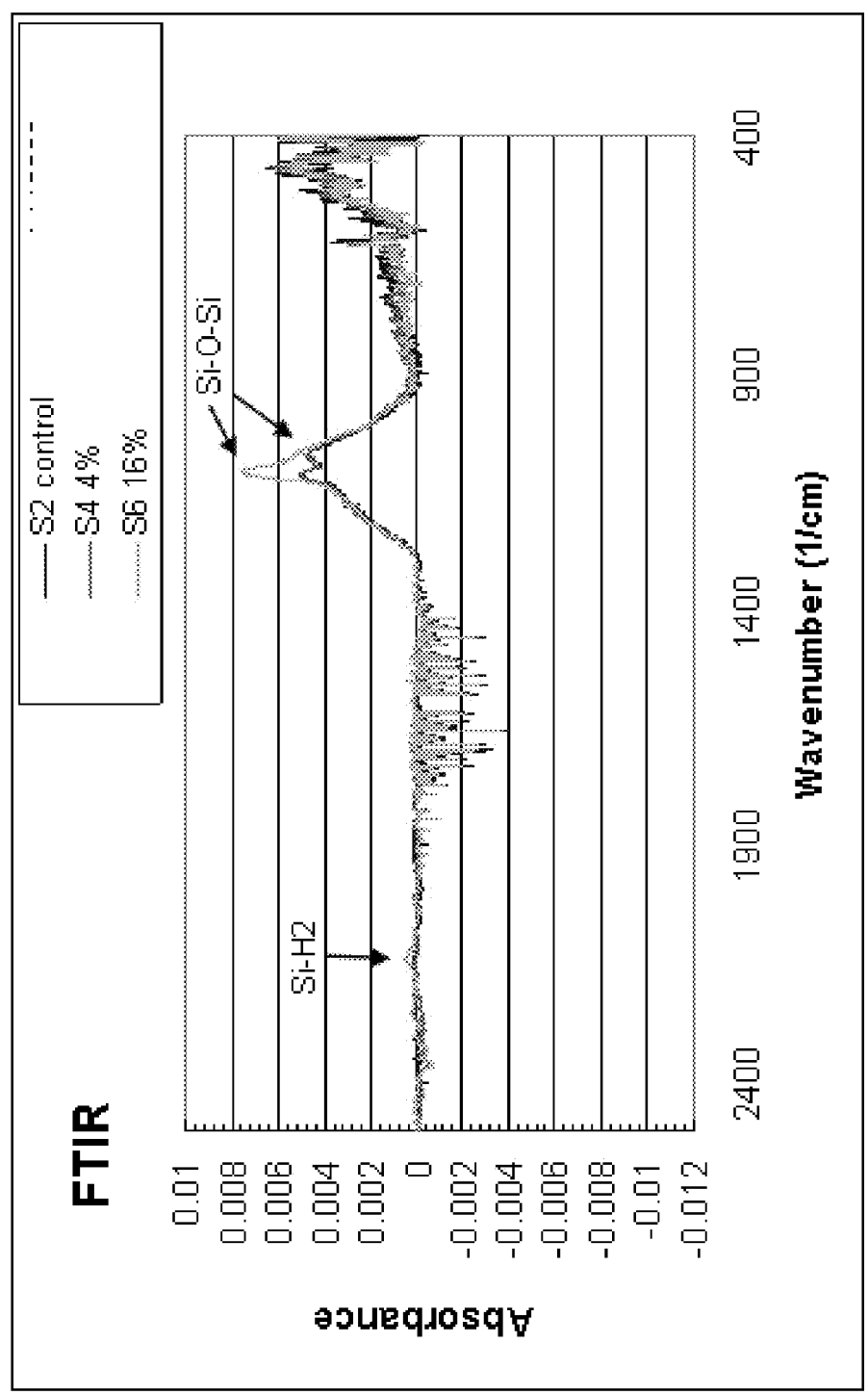
FIG. 8 shows FTIR spectra of substrates after a) exposure to photoresist strip plasma using 16% $H_2$ and a 12 hour 200° C. anneal in air and b) exposure to photoresist strip plasma using 4% $H_2$ and 12 hour 200° C. anneal in air, compared to control.

In the same or other embodiments as described above, a venting process can be performed after one or more hydrogen-based photoresist strip processes. FIG. 7 shows a flow diagram illustrating certain operations of a photoresist strip process. The process 700 begins at block 701 with providing a substrate having photoresist on it. As indicated above, in some embodiments, the photoresist and substrate have previously undergone an implant process. The process 700 continues at block 703 with performing a hydrogen-based strip process. Strip chemistries are discussed above and may, for example, include essentially $H_2$ diluted with $N_2$ or other inert diluent. Note that according to various embodiments, block 703 can include one or more of a crust removal operation, a bulk photoresist operation and an overstrip operation. During block 703, hydrogen is incorporated into the substrate. The process 700 continues at block 705 with venting at a relatively low temperature, e.g., between about 200° C. and 450° C. FIG. 8 shows FTIR spectra after a) exposure to photoresist strip plasma using 16% $H_2$ and a 12 hour 200° C. anneal in air and b) exposure to photoresist strip plasma using 4% $H_2$ and 12 hour 200° C. anneal in air, compared to control. FIG. 8 shows that the incorporated hydrogen can be driven out at a relatively low temperature. Without being bound by a particular theory it is believed that these relatively low temperatures can drive out the hydrogen atoms without causing dislocations that occur at higher temperatures used, for example, with RTP processes. A low temperature vent can occur at less than about 450° C., less than 400° C., less than about 300° C. according to various embodiments.

Returning to FIG. 7, in some embodiments, the process 700 continues at block 707 with a high temperature implant drive. A high temperature implant drive may involve a RTP process for example at temperatures of 800° C. or higher. In some embodiments, prior to block 707, blocks 703 and 705 are both performed multiple times, e.g., a vent operation can be performed each time a photoresist strip is performed during FEOL processing. In some other embodiments, block 703 is performed multiple times for different FEOL devices (e.g., once of NMOS fabrication, once for PMOS fabrication, etc.), with a single vent performed prior to block 707. In some other embodiments, multiple vent processes may be performed prior to block 707. For example, if block 703 is performed ten times, block 705 can be performed from one to ten times.

Inlet Gas

A hydrogen-containing gas, typically including molecular hydrogen, is introduced to the plasma source. The gas introduced to the plasma source contains the chemically active species that will be ionized or otherwise in the plasma source to form a plasma. As indicated above, in certain embodiments, an inlet gas may consist essentially of molecular hydrogen and one or more inert gases such as nitrogen. In some embodiments, the inlet gas includes no oxygen-containing compound. In some embodiments, the inlet gas includes only oxygen-containing compounds that are weak oxidants. One having ordinary skill in the art will understand that that trace amounts of other species may be present. The gas introduced to the plasma source may be premixed, partially mixed or unmixed.

Plasma Generation

Various types of plasma sources may be used in accordance with the invention, including RF, DC, and microwave based plasma sources. In a preferred embodiment, a downstream RF plasma source is used. Example RF plasma power for a 300 mm wafer ranges between about 300 Watts to about 10 Kilowatts. In some embodiments, the RF plasma power is between about 2000 Watts and 5000 Watts, e.g., 3500 W.

Showerhead Assembly

According to various embodiments, the plasma gas is distributed to the work surface via a showerhead assembly. The showerhead assembly may be grounded or have an applied voltage to attract some charge species while not affecting the flow of neutral species to the wafer, e.g., 0-1000 watt bias. Many of the electrically charged species in the plasma recombine at the showerhead. The assembly includes the showerhead itself which may be a metal plate having holes to direct the plasma and inert gas mixture into the reaction chamber. The showerhead redistributes the active hydrogen from the plasma source over a larger area, allowing a smaller plasma source to be used. The number and arrangement of the showerhead holes may be set to optimize strip rate and strip rate uniformity. If the plasma source is centrally located over the wafer, the showerhead holes are preferably smaller and fewer in the center of the showerhead in order to push the active gases toward the outer regions. The showerhead may have at least 100 holes. Suitable showerhead includes the Gamma xPR showerhead or the GxT drop-in showerhead available from Novellus Systems, Inc. of San Jose, Calif. In embodiments in which there is no showerhead assembly, the plasma enters the process chamber directly.

Process Chamber

The process chamber may be any suitable reaction chamber for the strip operation being performed. It may be one chamber of a multi-chambered apparatus or it may simply be a single chamber apparatus. The chamber may also include multiple stations where different wafers are processed simultaneously. The process chamber may be the same chamber where the implant, etch, or other resist-mediated process takes place. In other embodiments, a separate chamber is reserved for the strip. Process chamber pressure may range from about 600 mTorr to 2 Torr. In certain embodiments, the pressure ranges from about 0.9 Ton to 1.5 Torr.

The process chamber includes one or more processing stations on which strip operations are performed. In certain embodiments, the one or more processing stations includes a preheat station, at least one strip station, and an over-ash station. The wafer support is configured to support the wafer during processing. The wafer support may also transfer heat to and from the wafer during processing to adjust the wafer temperature as necessary. In certain embodiments, the wafer is supported on a plurality of minimum contacts and does not physically contact the wafer support surface plane. A spindle picks up the wafer and transfers the wafer from one station to another.

Figure 9:
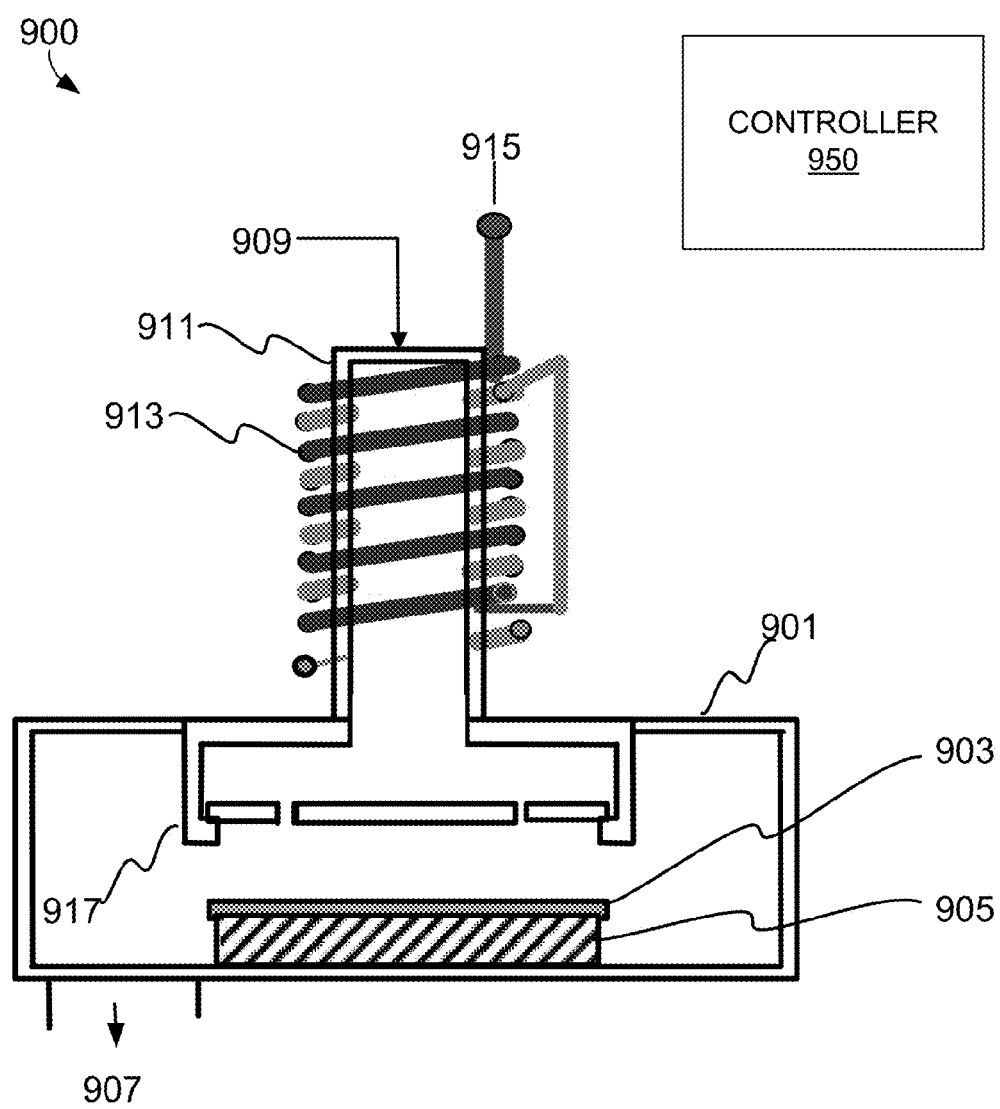
FIG. 9 is a schematic illustration showing aspects of a downstream plasma apparatus suitable for practicing the methods described herein.

FIG. 9 is a schematic illustration showing aspects of a downstream plasma apparatus 900 suitable for practicing the present invention on wafers. Apparatus 900 has a plasma producing portion 911 and an exposure chamber 901 separated by a showerhead assembly 917. Inside exposure chamber 901, a wafer 903 rests on a platen (or stage) 905. Platen 905 is fitted with a heating/cooling element. In some embodiments, platen 905 is also configured for applying a bias to wafer 903. Low pressure is attained in exposure chamber 901 via vacuum pump via conduit 907. Sources of gaseous hydrogen (with or without dilution/carrier gas) and carbon dioxide (or other weak oxidizing agent) provide a flow of gas via inlet 909 into plasma producing portion 911 of the apparatus. Plasma producing portion 911 is surrounded in part by induction coils 913, which are in turn connected to a power source 915. During operation, gas mixtures are introduced into plasma producing portion 911, induction coils 913 are energized and a plasma is generated in plasma producing portion 911. Showerhead assembly may have an applied voltage or be grounded directs the flow of species into exposure chamber 901. As mentioned, wafer 903 may be temperature controlled and/or a RF bias may be applied. Various configurations and geometries of the plasma source 911 and induction coils 913 may be used. For example, induction coils 913 may loop around the plasma source 911 in an interlaced pattern. In another example, the plasma source 911 may be shaped as a dome instead of a cylinder.

Figure 10:
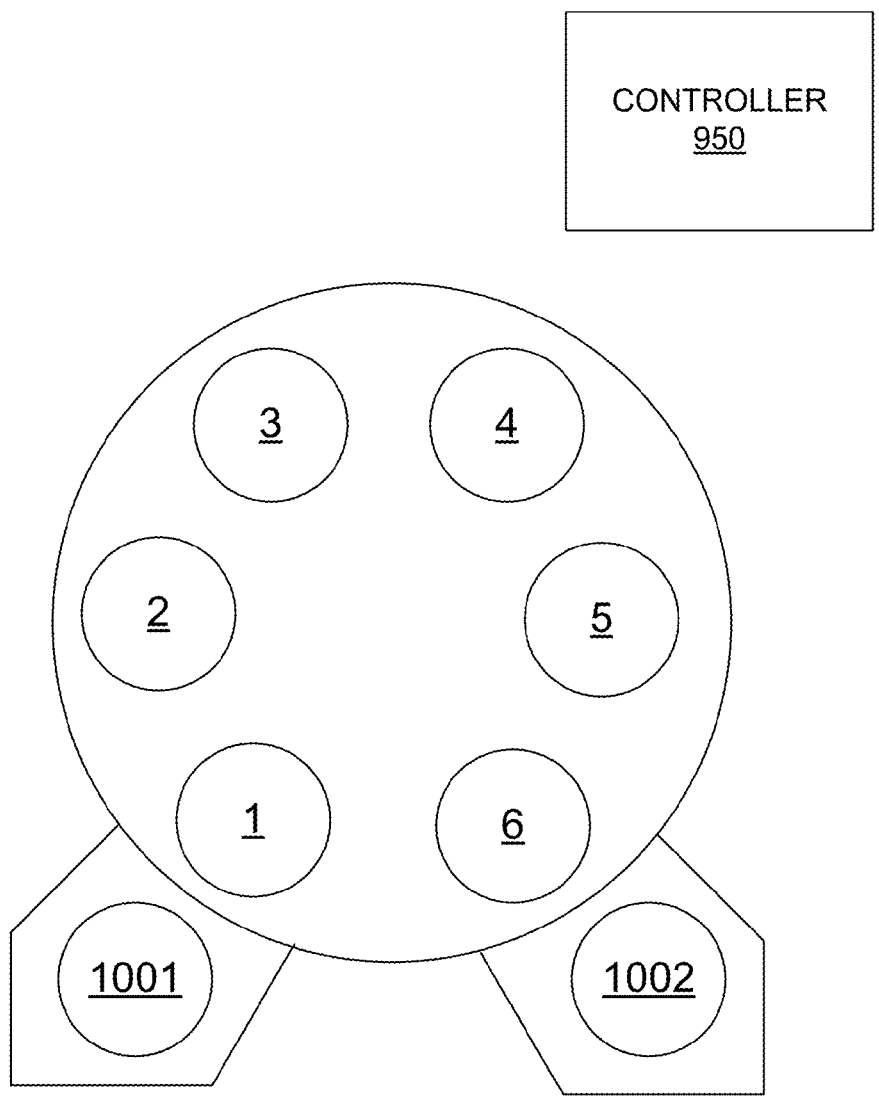
FIG. 10 is a simplified schematic showing a top view of a multi-station apparatus suitable for practicing the methods described herein.

Another aspect of the disclosure is an apparatus configured to accomplish the methods described herein. A suitable apparatus includes hardware for accomplishing the process operations and a system controller having instructions for controlling process operations in accordance with the present invention. Machine-readable media may be coupled to the controller and contain instructions for controlling process conditions for these operations. The system controller will typically include one or more memory devices and one or more processors configured to execute the instructions so that the apparatus will perform a method in accordance with embodiments of the present invention. Machine-readable media containing instructions for controlling process operations may be coupled to the system controller. In FIGS. 9 and 10, for example, a controller 950 may be connected to components of the process chamber, and control process gas composition, pressure, temperature and wafer indexing of the stripping operations.

Instructions for controlling process operations may be hardcoded or software. In some embodiments, the system controller includes programs, which can include logic of any form. For example, it can include logic hard coded on digital signal processors and similar processers that have specific algorithms implemented as hardware. It can also include software of firmware instructions that may be executed on a general purpose computer.

Suitable plasma chambers and systems include the Gamma 2100, 2130 I$^2$CP (Interlaced Inductively Coupled Plasma), G400, and GxT offered by Novellus Systems, Inc. of San Jose, Calif. Other systems include the Fusion line from Axcelis Technologies Inc. of Rockville, Md., TERA21 from PSK Tech Inc. in Korea, and the Aspen from Mattson Technology Inc. in Fremont, Calif. Additionally, various strip chambers may be configured onto cluster tools. For example, a strip chamber may be added to a Centura cluster tool available from Applied Materials of Santa Clara, Calif.

FIG. 10 is a simplified schematic showing a top view of a multi-station apparatus including stations 1, 2, 3, 4, 5 and 6. Wafers enter the apparatus at station 1 via chamber 1001, are transferred to each station in sequence for a processing operation at that station and exit from station 6 via chamber 1002 after the process is complete.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

While this invention has been described in terms of a few preferred embodiments, it should not be limited to the specifics presented above. Many variations on the above-described preferred embodiments may be employed.

The invention claimed is:

1. A method comprising:
   providing a substrate having an exposed silicon surface and an ion-implanted photoresist, the ion-implanted photoresist including a bulk photoresist and a carbonized outer layer on the bulk photoresist, disposed thereon to reaction chamber;
   exposing the substrate to a plasma generated from a process gas consisting essentially of nitrogen ($N_2$) and hydrogen ($H_2$), wherein the volumetric flow percentage of $H_2$ in the process gas is between about 2% and 16% and the balance of the process gas is $N_2$, to thereby remove photoresist from the substrate, wherein the substrate temperature is between about 200° C. and 285° C. and the chamber pressure is between 600 mTorr and 2 Torr.

2. The method of claim 1, wherein the volumetric flow percentage of $H_2$ is between about 2% and 10%.

3. The method of claim 1, wherein the volumetric flow percentage of $H_2$ is less than about 8%.

4. The method of claim 1, wherein the volumetric flow percentage of $H_2$ is about 4%.

5. The method of claim 1, wherein the substrate is exposed to the plasma for a time t and the cross-product of the volumetric flow percentage of $H_2$ [H] and the time t ([H]×t) is between about 50 and 2000 sccm-seconds.

6. The method of claim 5, wherein [H]×t is between about 50 and 500 sccm-seconds.

7. The method of claim 1, wherein the substrate temperature is between about 200° C. and 250° C.

8. The method of claim 1, further comprising applying photoresist to the substrate, exposing the photoresist to light, patterning the photoresist and transferring the pattern to the substrate.

9. A method comprising:
   providing a substrate having photoresist disposed thereon to reaction chamber;
   exposing the substrate to a plasma generated from a process gas consisting essentially of hydrogen gas ($H_2$) and nitrogen gas ($N_2$) wherein $H_2$ is present at a first volumetric flowrate and the balance of the process gas is $N_2$ and the $N_2$ is present in a higher volumetric flow percentage than $H_2$ to thereby remove photoresist from the substrate, wherein the substrate temperature is between about 200° C. and 285° C. and the chamber pressure is between 600 mTorr and 2 Torr;
   after exposing the substrate to the plasma, venting the substrate by exposing the substrate to a thermal anneal at a substrate temperature between about 200° C. and 450° C. to thereby remove incorporated hydrogen from a crystalline silicon (Si) surface of the substrate.

10. The method of claim 9, further comprising after venting the substrate, performing a high temperature implant drive process at a substrate temperature of at least about 800° C.

11. The method of claim 9, wherein the volumetric flow percentage of $H_2$ in the process gas is 16% or greater.

12. The method of claim 9, wherein the volumetric flow percentage of $H_2$ in the process gas is less than 16%.

13. The method of claim 9, wherein the volumetric flow percentage of $H_2$ in the process gas is less than 10%.

14. The method of claim 9, wherein the volumetric flow percentage of $H_2$ in the process gas is less than 5%.

15. The method of claim 9, wherein the substrate is vented at a temperature less than 400° C.

16. The method of claim 9, wherein hydrogen is incorporated into the crystalline silicon surface during the exposing operation.

17. An apparatus comprising:
a plasma source,
a gas inlet for introducing a gas mixture into the plasma source,
a showerhead positioned downstream of the gas inlet, and
a substrate support downstream of the showerhead, said substrate support comprising a pedestal and temperature-controlling mechanism to control a temperature of a substrate supported on the substrate support; and, a controller for executing a set of instructions, said set of instructions comprising instructions to introduce a gas mixture to the gas inlet consisting essentially of nitrogen ($N_2$) and hydrogen ($H_2$) and having a volumetric flow percentage of $H_2$ of between about 2% and 16%, wherein the balance of the gas mixture is $N_2$ and further wherein said set of instructions comprise instructions to expose the substrate to a plasma generated from the gas mixture for a time t such that the cross-product of the volumetric flow percentage of $H_2$ [H] and the time t ([H]×t) is between about 50 and 2000 sccm-seconds, and to maintain the substrate temperature between about 200° C. and 285° C. and the chamber pressure between 600 mTorr and 2 Torr.

18. The apparatus of claim 17, wherein [H]×t is between about 50 and 500 sccm-seconds.

* * * * *